US010043681B2

(12) United States Patent
Hsu et al.

(10) Patent No.: US 10,043,681 B2
(45) Date of Patent: Aug. 7, 2018

(54) FLUID SUPPLY SYSTEM, WAFER PROCESSING SYSTEM, AND METHOD OF SUPPLYING FLUID TO WAFER PROCESSING EQUIPMENT

(71) Applicant: TAIWAN SEMICONDUCTOR MANUFACTURING COMPANY, LTD., Hsinchu (TW)

(72) Inventors: Ching-Jung Hsu, Hsinchu (TW); Yung-Ti Hung, Hsinchu (TW); Chun-Feng Hsu, Hsinchu (TW); Nan-Peng Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 466 days.

(21) Appl. No.: 13/948,837

(22) Filed: Jul. 23, 2013

(65) Prior Publication Data

US 2015/0027552 A1 Jan. 29, 2015

(51) Int. Cl.
*H01L 21/67* (2006.01)

(52) U.S. Cl.
CPC ... *H01L 21/67017* (2013.01); *Y10T 137/0318* (2015.04); *Y10T 137/0368* (2015.04); *Y10T 137/0379* (2015.04); *Y10T 137/794* (2015.04); *Y10T 137/85954* (2015.04)

(58) Field of Classification Search
CPC ....... H01L 21/67017; Y10T 137/85954; B67D 7/0272; B67D 7/0266; C23C 16/4412; C23C 16/45593
USPC .......................................... 137/206, 209, 563
See application file for complete search history.

(56) References Cited

U.S. PATENT DOCUMENTS

| | | | | |
|---|---|---|---|---|
| 4,048,964 A | * | 9/1977 | Kissel | F02D 41/185 |
| | | | | 123/478 |
| 6,168,048 B1 | * | 1/2001 | Xu | B67D 7/025 |
| | | | | 222/1 |
| 6,453,938 B1 | * | 9/2002 | Ebster | C02F 1/02 |
| | | | | 137/337 |
| 2006/0144446 A1 | * | 7/2006 | Inagaki | C01B 17/69 |
| | | | | 137/561 R |
| 2006/0196541 A1 | * | 9/2006 | Gerken | B67D 7/0272 |
| | | | | 137/209 |

* cited by examiner

*Primary Examiner* — Kevin Murphy
*Assistant Examiner* — Nicole Gardner
(74) *Attorney, Agent, or Firm* — Hauptman Ham, LLP

(57) ABSTRACT

A fluid supply system includes a pressure tank configured to contain a pressurized gas and a fluid, a delivery point configured to be connected to a point of use, a recirculation piping connecting the pressure tank to the delivery point, and a return pump connected to the recirculation piping. The recirculation piping defines a circulation path for the fluid from the pressure tank through the delivery point and back to the pressure tank. The return pump is downstream of the delivery point and upstream of the pressure tank in the circulation path.

20 Claims, 3 Drawing Sheets

US 10,043,681 B2

FLUID SUPPLY SYSTEM, WAFER PROCESSING SYSTEM, AND METHOD OF SUPPLYING FLUID TO WAFER PROCESSING EQUIPMENT

BACKGROUND

Semiconductor manufacturing uses various types of fluid for processing wafers to form integrated circuits (ICs) thereon. Generally, a fluid for wafer processing is delivered from a supply vessel to wafer processing equipment via a supply system. The supply system is configured to deliver the fluid from the supply vessel to the wafer processing equipment, with considerations of potential degradation of the fluid during the delivery process.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
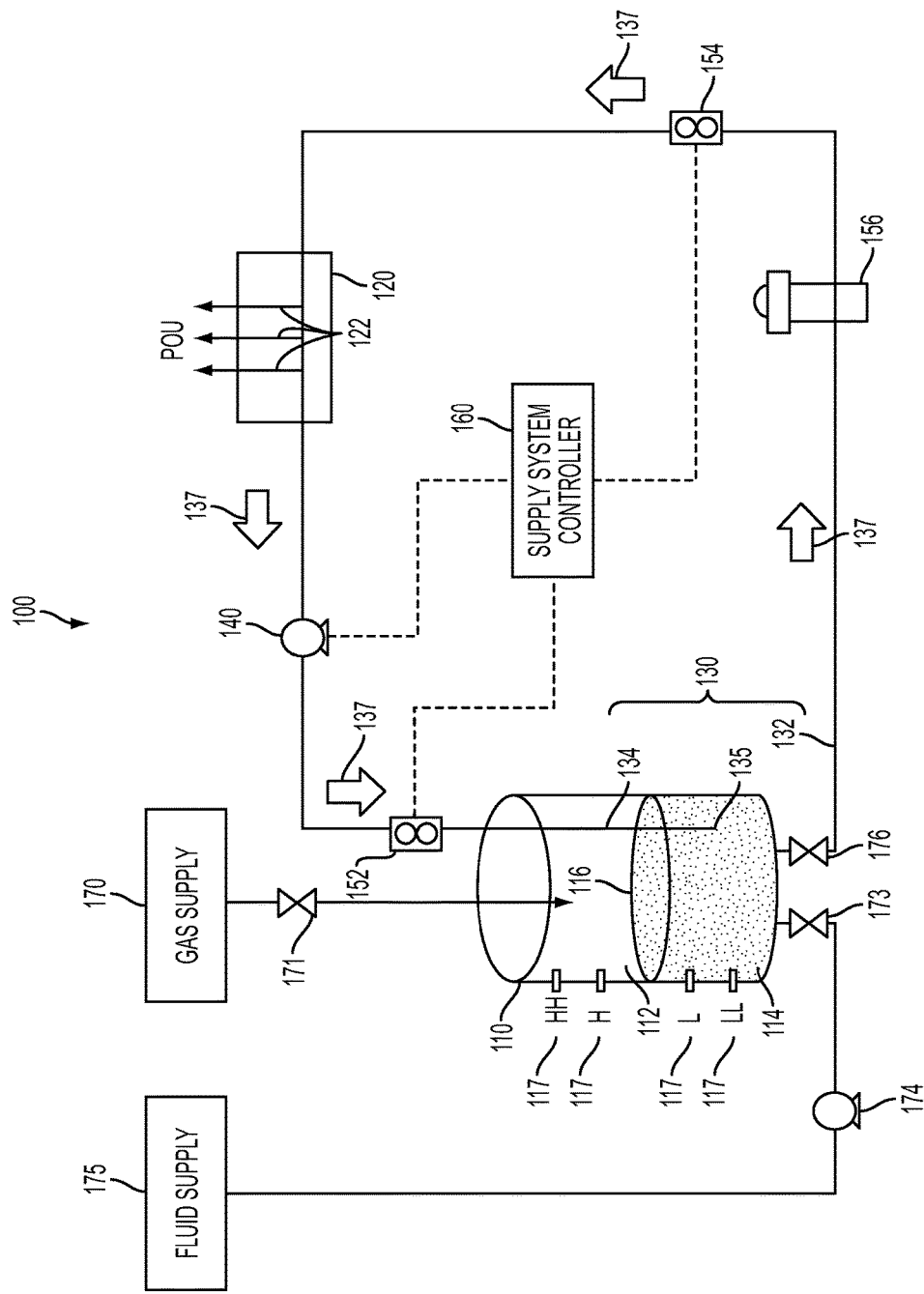
FIG. 1 is a schematic diagram of a fluid supply system in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, a fluid supply system comprises a recirculation piping defining a circulation path for a fluid from a pressure tank to a delivery point connectable to wafer processing equipment. A pressure of a pressurized gas in the pressure tank is used to deliver the fluid from the pressure tank to the delivery point. A return pump is used to return the fluid from the delivery point back to the pressure tank. In at least one embodiment, a flow meter is used to detect a flow rate of the fluid in the recirculation piping and the detected flow rate is used to control the return pump. As a result, it is possible in some embodiments to achieve one or more effects, such as improved fluid quality, lower power consumption, lower consumption of pressurized gas, and lower production cost and labor, compared to other approaches.

As used herein, "fluid" means a flowable material in the liquid phase, or in a combination of the liquid phase and the solid phase. Examples of flowable material in the liquid phase include, but are not limited to, deionized water (DI), deionized water mixed with $CO_2$ (hereinafter "$CO_2$-DI water") and various wafer processing chemicals. Examples of wafer processing chemical (hereinafter "chemicals") include, but are not limited to, $H_2SO_4$, $H_2O_2$, $NH_4OH$, thinners, developers, solvents etc. Examples of flowable material in a combination of the liquid phase and the solid phase include, but are not limited to, slurries for chemical-mechanical planarization and/or chemical-mechanical polishing. Such slurries include a liquid and solid particles dispersed therein.

FIG. 1 is a schematic diagram of a fluid supply system 100 in accordance with some embodiments. The fluid supply system 100 includes a pressure tank 110, a delivery point 120, a recirculation piping 130, and a return pump 140. The recirculation piping 130 defines a circulation path from the pressure tank 110 through the delivery point 120 and back to the pressure tank 110. Specifically, the recirculation piping 130 includes a supply piping 132 connecting the pressure tank 110 to the delivery point 120 in a supply portion of the circulation path. The recirculation piping 130 further includes a return piping 134 connecting the pressure tank 110 to the delivery point 120 in a return portion of the circulation path. The return pump 140 is connected to the return piping 134. The fluid supply system 100 further includes sensors 152, 154, a filter 156, and a supply system controller (hereinafter referred to as "controller") 160. The sensors 152, 154 and the filter 156 are connected to the recirculation piping 130. The controller 160 is coupled to the sensors 152, 154 and to the return pump 140.

The pressure tank 110 contains a pressurized gas 112 and a fluid 114. In the specific embodiment shown in FIG. 1 the pressurized gas 112 is contained in an upper portion of the pressure tank 110, and the fluid 114 is contained in a lower portion of the pressure tank 110. The fluid 114 contained in the pressure tank 110 has a surface 116. In at least one embodiment, the surface 116 of the fluid 114 contacts the pressurized gas 112. In at least one embodiment, a diaphragm or membrane is provided between the surface 116 of the fluid 114 and the pressurized gas 112. The pressure tank 110 further includes a plurality of level sensors 117 for detecting the level (i.e., the surface 116) of the fluid 114 in the pressure tank 110. In the specific embodiment shown in FIG. 1, the pressure tank 110 includes four level sensors 117 to indicate a very low level (LL), a low level (L), a high level (H), and a very high level (HH) of the fluid 114. In at least one embodiment, one or some or all of the level sensors 117 is/are omitted.

Examples of the fluid 114 include, but are not limited to, $CO_2$-DI water, slurries and chemicals. Examples of the pressurized gas 112 include, but are not limited to, inert gases, such as nitrogen. The pressure of the pressurized gas 112 contained in the pressure tank 110 is sufficient to move the fluid from the pressure tank 110 via the supply piping 132 to the delivery point 120. For example, the pressure of the pressurized gas 112 contained in the pressure tank 110 is from 20 to 60 psi. In at least one embodiment, the pressure of the pressurized gas 112 is about 40 psi. The pressure tank 110 is constructed to withstand the pressure of the pressurized gas 112. The pressure tank 110 is made of a material compatible with the fluid 114. Examples of material of the pressure tank 110 include, but are not limited to, stainless steel and plastic materials, such as polytetrafluoroethylene (PTFE), polyethylene (PE), and polypropylene (PP). Examples of the level sensors 117 include, but are not limited to, capacitive, optical and ultrasonic level sensors. A capacity of the pressure tank 110 is, for example, from 100 to 5000 liters. In at least one embodiment, the capacity of the pressure tank 110 is about 1000 liters.

The upper portion of the pressure tank 110 is connected, via an isolation valve 171, to a gas supply 170 to receive the pressurized gas 112 from the gas supply 170. The lower portion of the pressure tank 110 is connected, via an isolation valve 173 and a refill pump 174, to a fluid supply 175 to receive the fluid from the fluid supply 175. The lower portion of the pressure tank 110 is further connected, via an isolation valve 176, to the supply piping 132. The return piping 134 extends into the pressure tank 110, and has an opened end 135. In at least one embodiment, the opened end 135 is submerged below the surface 116 of the fluid 114 in the pressure tank 110. The isolation valves 171, 173, 176 allow for servicing of the pressure tank 110. The described connections of the pressure tank 110 to various components in the fluid supply system 100 reflect an example arrangement. Other connection arrangements are within the scope of various embodiments. For example, in at least one embodiment, one or more of the isolation valves 171, 173, 176 is/are omitted. In at least one embodiment, the fluid supply 175 is connected to the pressure tank 110 via a refill piping having an open end submerged below the surface 116 of the fluid 114, similarly to the return piping 134. Various pipings and isolation valves connected to the pressure tank 110 for handling the fluid are made of materials compatible with the fluid. For example, one or more of the isolation valves 173, 176, the supply piping 132 and the return piping 134 is/are made of stainless steel and plastic materials, such as PTFE, PE, and polypropylene.

In some embodiments, the delivery point 120 includes a manifold with one or more pipings 122 branching out from the manifold to be connected to one or more points of use (POU). In at least one embodiment, one or move valves are included in the pipings 122 and/or in the POU to control the flow and/or amount of the fluid to be delivered to the POU. In one or more embodiments, the POU includes one or more wafer processing equipment configured to perform one or more processings on semiconductor wafers. Examples of processing performed by the wafer processing equipment at the POU include, but are not limited to, film deposition, etching, stripping, cleaning, planarization (e.g., chemical-mechanical planarization) and polishing (e.g., chemical-mechanical polishing).

The recirculation piping 130 is configured to circulate the fluid from the pressure tank 110 to the delivery point 120 and then back to the pressure tank 110 in a closed loop as indicated by arrows 137. The sensors 152, 154 are configured to detect one or more parameters of a flow of the fluid in the recirculation piping 130. The controller 160 is coupled to the sensors 152, 154 to control the flow of the fluid in the recirculation piping 130 based on the parameters detected by the sensors 152, 154. For example, the sensor 152 is a flow meter configured to detect a flow rate of the flow of the fluid in the recirculation piping 130. The controller 160 is configured to control a speed of the return pump 140 based on the flow rate detected by the flow meter 152. In at least one embodiment, the flow meter 152 is connected to the return piping 134 to detect the return flow of the fluid from the delivery point 120 to the pressure tank 110. In at least one embodiment, the flow meter 152 is connected to the supply piping 132. In at least one embodiment, more than one flow meters are connected to the recirculation piping 130, for example, with one flow meter connected to the supply piping 132 and another flow meter connected to the return piping 134. In at least one embodiment, the flow meter 152 and/or the controller 160 is/are incorporated in the return pump 140. In at least one embodiment, the flow meter 152 and/or the controller 160 is/are omitted.

In some embodiments, the sensor 154 is a pressure sensor configured to detect the pressure of the fluid flowing in the recirculation piping 130. In at least one embodiment, the controller 160 is configured to control the amount of the pressurized gas 112 in the pressure tank 110 based on the pressure detected by the pressure sensor 154. In at least one embodiment, the pressure sensor 154 is connected to the supply piping 132 to detect the pressure of the fluid being delivered to the POU via the delivery point 120. In at least one embodiment, the pressure sensor 154 is connected to the return piping 134. In at least one embodiment, more than one pressure sensors are connected to the recirculation piping 130, for example, with one pressure sensor connected to the supply piping 132 and another pressure sensor connected to the return piping 134. In at least one embodiment, the pressure sensor 154 is omitted.

The filter 156 is connected to the recirculation piping 130 to improve quality of the fluid flowing in the recirculation piping 130. For example, the filter 156 is connected to the supply piping 132 upstream of the delivery point 120 to remove particles greater than a predetermined size, e.g., a few microns, from the fluid before the fluid is delivered to the POU via the delivery point 120. In at least one embodiment, the filter 156 is omitted.

The return pump 140 is connected to the return piping 134 downstream of the delivery point 120 and upstream of the pressure tank 110. The return pump 140 is configured to move the fluid, unused by the POU, from the delivery point 120 via the return piping 134 back to the pressure tank 110. The return pump 140 is constructed from materials compatible with the fluid, such as stainless steel, PTFE, PE, and PP. Example types of pump usable as the return pump 140 include, but are not limited to, vacuum-pressure technology pumps and maglev centrifugal pumps. In at least one embodiment, no pumping mechanism is connected to the supply piping 132, all the way from the pressure tank 110 to the delivery point 120.

In operation of the fluid supply system 100, the isolation valves 171 and 176 are open and the isolation valve 173 is closed. The fluid 114 is forced, at least in part, by the pressure of the pressurized gas 112 to flow out of the pressure tank 110 along the supply piping 132 to the delivery point 120. A portion of the fluid not drawn away by the POU is returned to the pressure tank 110 via the return piping 134 under the pumping action of the return pump 140. As a result, the fluid is circulated without being stagnant. In some embodiments, even if the POU does not withdraw the fluid from the delivery point 120, the fluid is still circulated through the recirculation piping 130.

The flow meter 152 sends a signal indicating the detected flow rate of the fluid in the return piping 134 to the controller 160. In some embodiments, in response to the signal received from the flow meter 152, the controller 160 sends a control signal to the return pump 140 to adjust the speed of the return pump 140 to maintain the flow rate of the fluid in the return piping 134 constant. For example, when the POU withdraws the fluid from the delivery point 120, the amount of the fluid flowing in the recirculation piping 130 drops. As a result, the flow rate in the return flow of the fluid from the delivery point 120 back to the pressure tank 110 drops. The flow meter 152 detects the dropped flow rate and sends a corresponding signal to the controller 160. The controller 160 sends a control signal to increase the speed of the return pump 140, thereby maintaining the flow rate of the return flow of the fluid at a predetermined level detected at the flow meter 152 before the POU starts withdrawing the fluid. When the POU stops withdrawing the fluid from the delivery point 120, the flow rate in the return flow of the fluid from the delivery point 120 back to the pressure tank 110 increases. The flow meter 152 detects the increased flow rate and sends a corresponding signal to the controller 160. The controller 160 sends a control signal to reduce the speed of the return pump 140, thereby maintaining the flow rate of the return flow of the fluid at the predetermined level. In at least one embodiment, the flow rate of the fluid is maintained at a level between 1 and 10 liters per minute. The described constant flow rate control is an example arrangement. Other control arrangements are within the scope of various embodiments. For example, in one or more embodiments, the flow rate is maintained at a lower level when the POU does not withdraw the fluid, and is maintained at a higher level during the fluid withdrawal by the POU. The lower flow rate is to maintain a quality of the fluid as described herein below, without excessive power consumption and/or excessive fluid circulation that potentially degrades the fluid quality. The higher flow rate is to meet a specification of the wafer processing performed at the POU.

The pressure sensor 154 sends a signal indicating the detected pressure of the fluid in the supply piping 132 to the controller 160. In some embodiments, in response to the signal received from the pressure sensor 154, the controller 160 sends a control signal to the gas supply 170 to adjust the amount of the pressurized gas in the pressure tank to maintain the pressure of the fluid flowing in the supply piping 132 constant. For example, when the POU withdraws the fluid from the delivery point 120, the amount of the fluid flowing in the recirculation piping 130 drops. As a result, the pressure of the fluid flowing from the pressure tank 110 to the delivery point 120 drops. The pressure sensor 154 detects the dropped pressure sends a corresponding signal to the controller 160. The controller 160 sends a control signal to the gas supply 170 to increase the amount of the pressurized gas in the pressure tank 110 to keep the pressure of the fluid flowing to the delivery point 120 at a predetermined level detected at the pressure sensor 154 before the POU starts withdrawing the fluid. When the POU stops withdrawing the fluid from the delivery point 120, the pressure in the fluid flowing to the delivery point 120 increases. The pressure sensor 154 detects the increased pressure and sends a corresponding signal to the controller 160. The controller 160 sends a control signal to the gas supply 170 to reduce the amount of the pressurized gas in the pressure tank 110 to keep the pressure of the fluid flowing to the delivery point 120 at the predetermined level. The described constant pressure control is an example arrangement. Other control arrangements are within the scope of various embodiments.

In at least one embodiment, in response to the signal received from the pressure sensor 154, the controller 160 sends a control signal to the return pump 140 to adjust the speed of the return pump 140 in lieu of, or in addition to, the adjustment of the amount of the pressurized gas in the pressure tank 110. For example, a drop of the pressure detected at the pressure sensor 154 indicates that the POU starts withdrawing the fluid, and the controller 160 increases the speed of the return pump 140 to maintain a constant flow rate in the return flow from the delivery point 120 back to the pressure tank 110.

In at least one embodiment, the described control action of the controller 160 based on the pressure detected by the pressure sensor 154 is omitted. Instead, the gas supply 170 is configured to keep the pressure of the pressurized gas 112 in the pressure tank 110 constant, thereby maintaining the pressure of the fluid flowing to the delivery point 120 constant before, during and after the fluid withdrawal by the POU. In at least one embodiment, the gas supply 170 keeps the pressure of the pressurized gas 112 in the pressure tank 110 based on the pressure detected by the pressure sensor 154, and/or based on the pressure detected by another pressure sensor installed in the pressure tank 110.

In some embodiments, when the amount of the fluid 114 in the pressure tank 110 drops to a predetermined low level detected by one or more of the level sensors 117, the circulation of the fluid in the recirculation piping 130 is stopped and a refill operation is started. The isolation valve 176 is closed and the isolation valve 173 is open. The isolation valve 171 remains open. The refill pump 174 is operated to move the fluid from the fluid supply 175 into the pressure tank 110. The pressure of the refilling fluid moved by the refill pump 174 is higher than the pressure of the pressurized gas 112 in the pressure tank 110, e.g., by 3-10 psi. For example, the pressure created by the refill pump 174 is about 45 psi compared to the pressure of 40 psi of the pressurized gas 112 in the pressure tank 110. When the level of the fluid 114 refilled in the pressure tank 110 reaches a predetermined high level detected by one or more of the level sensors 117, the refill operation is stopped by shutting down the refill pump 174, closing the isolation valve 173, and opening the isolation valve 176 to resume the circulation of the fluid along the recirculation piping 130. In at least one embodiment, the circulation of the fluid in the recirculation piping 130 continues during the refill operation. In at least one embodiment, no discharge of the pressurized gas from the pressure tank 110 is performed during the refill operation.

In at least one embodiment, the delivery of the fluid by the pressurized gas from the pressure tank 110 to the delivery point 120 is advantageous over other approaches that use a supply pump to move a fluid to a delivery point. Specifically, the fluid delivery by the pressurized gas in accordance with some embodiments permits smoother fluid delivery which is substantially pulseless. Additionally or alternatively, the fluid delivered by the pressurized gas to the delivery point in accordance with some embodiments is free of contaminants shed from moving parts of a supply pump and/or shear forces acted by such moving parts on the fluid. As a result, a substantially pulseless delivery of the fluid to the delivery point with a constant pressure and without negative impacts of shear forces acting on the fluid is obtainable. Such a fluid delivery is beneficial to various fluid-using processes, especially processes using slurries, such as chemical-mechanical planarization and/or chemical-mechanical polishing (hereinafter commonly referred to as "CMP").

A slurry includes small particles suspended in a liquid. Agglomeration of such small particles is possible if sufficiently strong external forces, such as shear forces generated by moving parts of a supply pump, are applied to the suspended particles. The small particles are agglomerated into larger particles. The presence of large particles in the slurry is likely to cause scratches and/or other defects on the wafer surfaces to which the slurry is applied, e.g., in a CMP process. By using the pressurized gas, instead of a supply pump, to deliver the slurry to the delivery point in some embodiments, shear forces acting on, and agglomeration of, small particles in the slurry delivered at the delivery point are avoidable, thereby increasing the quality of the slurry-using process and manufacturing yield, compared to other approaches using supply pumps. One or more of these effects is/are also beneficial in some embodiments where the fluid is another chemical sensitive to mechanical impacts causing by moving parts of a supply pump.

In at least one embodiment, the use of the return pump 140 to move the unused fluid from the delivery point 120 to the pressure tank 110 is advantageous over other approaches that use a supply pump to both move a fluid to a delivery point and to create a return flow from the delivery point to a fluid tank. Specifically, to create the same flow rate in the return flow of the fluid from the delivery point to the tank, the return pump 140 disposed downstream of the delivery point 120 uses less power than a supply pump disposed upstream of the delivery point. The power consumption saving achievable in at least one embodiment is as large as 75% compared to analogues systems of other approaches.

In at least one embodiment, the combination of the slurry delivery by the pressurized gas to the delivery point 120 and the use of the return pump 140, such as a vacuum-pressure technology pump or a maglev centrifugal pump, to return the unused slurry to the pressure tank 110 makes it possible to achieve an advantageous particle size distribution (PSD) in the slurry. As described herein, the slurry delivery by the pressurized gas to the delivery point 120 in accordance with some embodiments does not involve mechanical impacts associated with moving parts of a supply pump. As a result, the PSD of the slurry delivered at the delivery point 120 is substantially similar to the slurry in the pressure tank 110. Although the return pump 140 exerts some external forces on the slurry returning from the delivery point 120, the choice of a vacuum-pressure technology pump or a maglev centrifugal pump for the return pump 140 makes it possible to minimize, or at least reduce, agglomeration of the suspended particles in the returning slurry. As a result, the slurry returned to the pressure tank 110 by the return pump 140 has little changes in PDS compared to the slurry in the pressure tank 110. Such a little PDS change after each circulation permits a greater number of circulations to be performed in the fluid supply system 100 in accordance with some embodiments, before the slurry PDS degrades to a point that prompts a system flush. Compared to other approaches with a greater degree of slurry PDS degradation, the fluid supply system 100 in one or more embodiments provides greater production time and lower downtime.

In at least one embodiment, the circulation of the fluid in the recirculation piping 130 before, during and after the POU withdraws the fluid from the delivery point 120 is advantageous over other approaches that do not use fluid circulation. Specifically, a constant movement of a slurry keeps the particles suspended in the slurry; otherwise, it is possible that the slurry, when stagnant, will agglomerate or even solidify. A quality and/or infiltration rate of various chemicals is/are also improved if the chemicals are in constant movement, without being stagnant in a dead zone. With respect to $CO_2$-DI water, the circulation of the $CO_2$-DI water maintains the intended concentration of $CO_2$, and reduces the operating cost of a $CO_2$-DI water generator and/or the consumption of $CO_2$ and/or DI water in the manufacturing facility. The reduced usage of $CO_2$ achievable in at least one embodiment is as much as 74% compared to analogues systems of other approaches. One or more of the above discussed effects is/are not obtainable in other approaches where fluid circulation is not employed.

In at least one embodiment, a single circulation path defined by the recirculation piping 130 through the pressure tank 110, delivery point 120 and return pump 140 is advantageous over other approaches that use more than one circulation paths. Specifically, maintenance of the fluid supply system 100 with a single circulation path in one or more embodiments is simpler than the other approaches with multiple circulation paths. Further, in an arrangement with several circulation paths, switches are employed to switch from one circulation path to another. As a result, the fluid supply control is complicated, the pressure of the delivered fluid is likely unstable due to the switching action, and a service life of the fluid supply system is likely reduced. In contrast, switches are not employed in some embodiments with a single circulation path, thereby simplifying the control hardware and process, keeping the pressure of the delivered fluid stable and/or increasing the service life of the fluid supply system.

Further, several other approaches completely or partially empty the tank for refilling which is likely to release a large amount of gas from the tank. The refill process in one or more embodiments does not release the pressurized gas from the pressure tank 110, thereby saving a large amount of the pressurized gas and the associated cost. In at least one embodiment, the amount of pressurized gas saved compared to the other approaches is as large as 57%.

Figure 2:
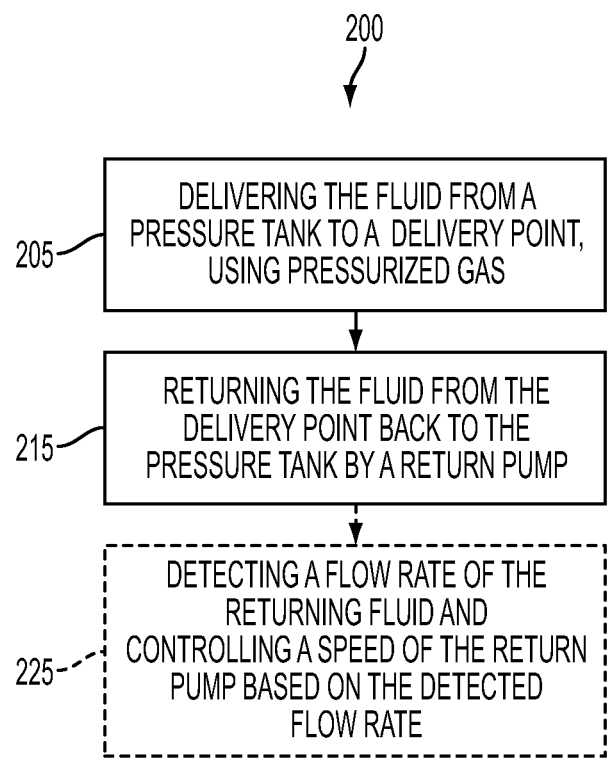
FIG. 2 is a flow chart of a method of supplying a fluid to wafer processing equipment in accordance with some embodiments.

FIG. 2 is a flow chart of a method 200 of supplying a fluid to wafer processing equipment in accordance with some embodiments. In at least one embodiment, the method 200 is performed by the fluid supply system 100 described with respect to FIG. 1.

At operation 205, a fluid is delivered, using a pressurized gas, from a pressure tank via a supply piping to a delivery point. For example, the fluid is delivered from the pressure tank 110 via the supply piping 132 to the delivery point 120 by the pressurized gas 112 contained in the pressure tank 110, as described with respect to FIG. 1.

At operation 215, the fluid is returned from the delivery point via a return piping back to the pressure tank by a return pump. For example, the fluid is returned from the delivery point 120 via the return piping 134 back to the pressure tank 110 by the return pump 140, as described with respect to FIG. 1.

At operation 225, a flow rate of the fluid in the return piping is detected and a speed of the return pump is controlled based on the detected flow rate. For example, a flow rate of the fluid in the return piping 134 is detected by the flow meter 152, and a speed of the return pump 140 is controlled by the controller 160 based on the detected flow rate, as described with respect to FIG. 1. In at least one embodiment, the operation 225 is omitted. One or more effects discussed above with respect to the fluid supply system 100 is/are applicable to the method 200 in accordance with some embodiments.

The above method(s) include(s) example operations, but the operations are not necessarily performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, one or more operations of the controller 160 is/are performed by one or more computer systems.

Figure 3:
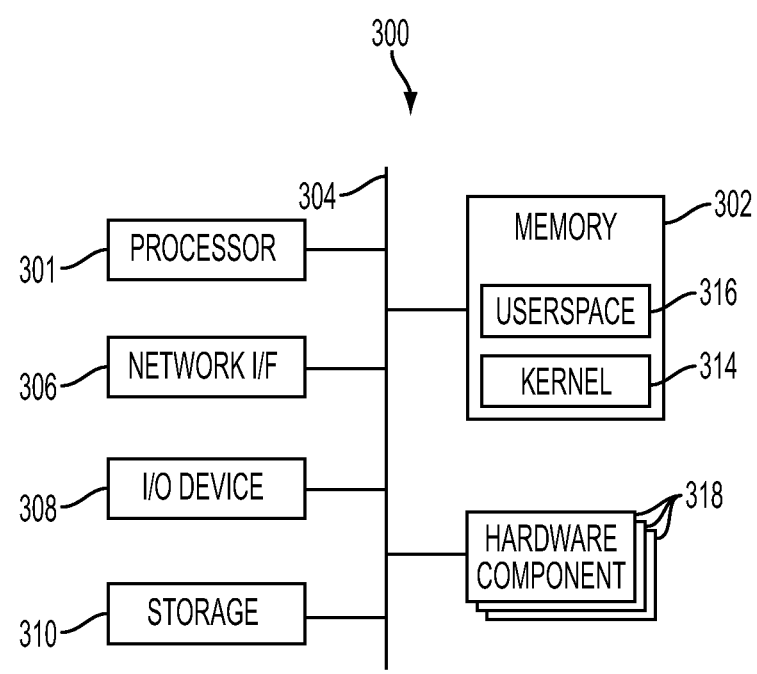
FIG. 3 is a block diagram of a computer system in accordance with some embodiments.

FIG. 3 is a block diagram of a computer system 300, in accordance with some embodiments. The computer system 300 comprises a processor 301, a memory 302, a network interface (I/F) 306, a storage 310, an input/output (I/O) device 308, and one or more hardware components 318 communicatively coupled via a bus 304 or other interconnection communication mechanism.

The memory 302 comprises, in some embodiments, a random access memory (RAM) and/or other dynamic storage device and/or read only memory (ROM) and/or other static storage device, coupled to the bus 304 for storing data and/or instructions to be executed by the processor 301, e.g., kernel 314, userspace 316, portions of the kernel and/or the userspace, and components thereof. The memory 302 is also used, in some embodiments, for storing temporary variables or other intermediate information during execution of instructions to be executed by the processor 301.

In some embodiments, a storage device 310, such as a magnetic disk or optical disk, is coupled to the bus 304 for storing data and/or instructions, e.g., kernel 314, userspace 316, etc. The I/O device 308 comprises an input device, an output device and/or a combined input/output device for enabling user interaction with the system 300. An input device comprises, for example, a keyboard, keypad, mouse, trackball, trackpad, and/or cursor direction keys for communicating information and commands to the processor 301. An output device comprises, for example, a display, a printer, a voice synthesizer, etc. for communicating information to a user.

In some embodiments, one or more of the processes or functionality described herein are realized by a processor, e.g., the processor 301, which is programmed for performing such processes. One or more of the memory 302, the I/F 306, the storage 310, the I/O device 308, the hardware components 318, and the bus 304 is/are operable to receive instructions, data, and/or other parameters for processing by the processor 301. In some embodiments, one or more of the processes or functionality is/are performed by specifically configured hardware (e.g., by one or more application specific integrated circuits or ASIC(s)) which is/are included) separate from or in lieu of the processor. Some embodiments incorporate more than one of the described processes in a single ASIC.

According to some embodiments, a fluid supply system comprises a pressure tank configured to contain a pressurized gas and a fluid, a delivery point configured to be connected to a point of use, a recirculation piping connecting the pressure tank to the delivery point, and a return pump connected to the recirculation piping. The recirculation piping defines a circulation path for the fluid from the pressure tank through the delivery point and back to the pressure tank. The return pump is downstream of the delivery point and upstream of the pressure tank in the circulation path.

According to some embodiments, a wafer processing system comprises a pressure tank containing a pressurized gas and a fluid, a delivery point, a supply piping connected between the pressure tank and the delivery point, wafer processing equipment connected to the delivery point, a return piping connected between the pressure tank and the delivery point, and a return pump connected to the return piping. A pressure of the pressurized gas in the pressure tank is sufficient to move the fluid from the pressure tank via the supply piping to the delivery point. The wafer processing equipment is configured to process semiconductor wafers with the fluid supplied to the delivery point from the pressure tank. The return pump is configured to move the fluid from the delivery point back to the pressure tank.

In a method of supplying a fluid to wafer processing equipment in accordance with some embodiments, a fluid is delivered from a pressure tank via a supply piping to a delivery point. The delivery point is connected to the wafer processing equipment. The pressure tank contains the fluid and a pressurized gas of a pressure sufficient to move the fluid from the pressure tank via the supply piping to the delivery point. The fluid is returned from the delivery point via a return piping back to the pressure tank by a return pump connected to the return piping.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A fluid supply system, comprising:
   a pressure tank configured to contain a pressurized gas and a fluid;
   a delivery point configured to be connected to a point of use;
   a refill piping configured to supply the fluid to the pressure tank from a fluid supply;
   a refill pump connected to the refill piping, wherein the refill pump is configured to move the fluid from the fluid supply to the pressure tank;
   a recirculation piping connecting the pressure tank to the delivery point, the recirculation piping defining a circulation path for the fluid from the pressure tank through the delivery point and back to the pressure tank, wherein the recirculation piping is completely separate from the refill piping;
   a return pump connected to the recirculation piping, wherein the return pump is downstream of the delivery point and upstream of the pressure tank in the circulation path, and the return pump is separate from the refill pump;
   a sensor connected to the recirculation piping, the sensor configured to detect a parameter of a flow of the fluid in the recirculation piping, wherein the sensor comprises at least one of a pressure sensor or a flow meter; and
   a controller connected to the sensor, the controller configured to control the flow of the fluid in the recirculation piping based on the parameter detected by the sensor.

2. The fluid supply system of claim 1, wherein the pressure tank is configured to contain the pressurized gas at a pressure sufficient to move the fluid from the pressure tank via a supply portion of the recirculation piping to the delivery point.

3. The fluid supply system of claim 2, wherein the return pump is configured to move the fluid from the delivery point via a return portion of the recirculation piping back to the pressure tank, the return pump connected to the return portion of the recirculation piping.

4. The fluid supply system of claim 1, wherein
   the parameter comprises a flow rate of the flow of the fluid;
   the sensor comprises the flow meter connected to the recirculation piping, the flow meter configured to detect the flow rate of the flow of the fluid; and
   the controller is configured to control a speed of the return pump based on the flow rate detected by the flow meter.

5. The fluid supply system of claim 1, wherein
   the parameter comprises a pressure of the fluid in the flow;
   the sensor comprises the pressure sensor connected to the recirculation piping, the pressure sensor configured to detect the pressure of the fluid in the flow; and
   the controller is configured to control an amount of the pressurized gas in the pressure tank based on the pressure detected by the pressure sensor.

6. The fluid supply system of claim 1, further comprising:
   a filter in the recirculation piping upstream of the delivery point in the circulation path, the filter configured to remove particles greater than a predetermined size from the fluid flowing in the recirculation piping toward the delivery point.

7. The fluid supply system of claim 1, wherein, upstream of the delivery point in the circulation path, the recirculation piping is free of pumping mechanisms connected thereto.

8. A wafer processing system, comprising:
a pressure tank containing a pressurized gas and a fluid, wherein the pressure tank comprises a first port and a second port, and the first port is spaced from the second port;
a delivery point;
a supply piping connected between the pressure tank and the delivery point, wherein a pressure of the pressurized gas in the pressure tank is sufficient to move the fluid from the pressure tank via the supply piping to the delivery point;
wafer processing equipment connected to the delivery point, the wafer processing equipment configured to process semiconductor wafers with the fluid supplied to the delivery point from the pressure tank;
a refill pump configured to move the fluid from a fluid supply to the pressure tank, wherein the refill pump is connected to the first port;
a return piping connected between the pressure tank and the delivery point;
a return pump connected to the return piping, the return pump configured to move the fluid from the delivery point back to the pressure tank, wherein the return pump is connected to the second port;
a first sensor connected to the supply piping between the pressure tank and the delivery point, wherein the first sensor is configured to detect a first flow parameter of the fluid in the supply piping; and
a second sensor connected to the return piping between the return pump and the pressure tank, wherein the second sensor is configured to detect a second flow parameter of the fluid in the return piping.

9. The wafer processing system of claim 8, wherein the second sensor comprises a flow meter, the flow meter configured to detect a flow rate of the fluid in the return piping; and
the wafer processing system further comprises a controller connected to the flow meter and the return pump, the controller configured to control a speed of the return pump based on the flow rate detected by the flow meter.

10. The wafer processing system of claim 9, wherein the controller is configured to control the speed of the return pump to maintain the flow rate of the fluid in the return piping as constant.

11. The wafer processing system of claim 9, wherein the first sensor comprises a pressure sensor, the pressure sensor configured to detect a pressure of the fluid flowing in the supply piping, and
the controller is configured to control an amount of the pressurized gas in the pressure tank based on the pressure detected by the pressure sensor.

12. The wafer processing system of claim 11, wherein the controller is configured to control the amount of the pressurized gas in the pressure tank to maintain the pressure of the fluid flowing in the supply piping toward the delivery point as constant.

13. The wafer processing system of claim 9, wherein the fluid comprises at least one material selected from the group consisting of slurry for chemical mechanical planarization or polishing, deionized water mixed with $CO_2$, and a wafer processing chemical.

14. The wafer processing system of claim 9, wherein the supply piping is free of pumping mechanisms connected thereto.

15. A method of supplying a fluid to wafer processing equipment, the method comprising:
delivering the fluid from a pressure tank via a supply piping to a delivery point, the delivery point connected to the wafer processing equipment, the pressure tank containing the fluid and a pressurized gas of a pressure sufficient to move the fluid from the pressure tank via the supply piping to the delivery point, and the pressurized gas directly contacts the fluid;
returning the fluid from the delivery point via a first flow path back to the pressure tank by a return pump connected between the delivery point and the pressure tank;
refilling the fluid in the pressure tank via a second flow path, wherein the first flow path fails to overlap with the second flow path;
detecting a parameter of a flow of the fluid in the first flow path using a sensor connected to the first flow path, wherein the sensor comprises at least one of a pressure sensor or a flow meter; and
controlling the flow of the fluid in the first flow path based on the parameter detected by the sensor.

16. The method of claim 15, further comprising:
detecting a flow rate of the fluid in the first flow path; and
controlling a speed of the return pump based on the detected flow rate.

17. The method of claim 15, further comprising:
detecting a pressure of the fluid flowing in at least one of the supply piping or the first flow path; and
controlling an amount of the pressurized gas in the pressure tank based on the detected pressure.

18. The method of claim 15, further comprising:
circulating the fluid from the pressure tank via the supply piping to the delivery point and then via the first flow path back to the pressure tank even if the wafer processing equipment does not withdraw the fluid from the delivery point.

19. The fluid supply system of claim 1, wherein the pressure tank further comprises a plurality of level sensors.

20. The method of claim 15, further comprising detecting a level of the fluid in the pressure tank.

* * * * *